(12) United States Patent
Gießibl

(10) Patent No.: US 9,958,295 B2
(45) Date of Patent: May 1, 2018

(54) DEVICE FOR COMPENSATING EXTERNAL MAGNETIC STRAY FIELDS OR FOR COMPENSATING THE INFLUENCE OF A MAGNETIC FIELD GRADIENT ON A MAGNETIC FIELD SENSOR

(71) Applicant: Methode Electronics Malta Ltd., Birkirkara (MT)

(72) Inventor: Johannes Gießibl, Amerang (DE)

(73) Assignee: METHODE ELECTRONICS MALTA LTD., Birkirkara (MT)

(*) Notice: Subject to any disclaimer, the term of this patent is extended or adjusted under 35 U.S.C. 154(b) by 0 days. days.

(21) Appl. No.: 15/264,938

(22) Filed: Sep. 14, 2016

(65) Prior Publication Data

US 2017/0089732 A1    Mar. 30, 2017

(30) Foreign Application Priority Data

Sep. 25, 2015 (DE) .................. 10 2015 116 303
Sep. 25, 2015 (DE) .................. 20 2015 105 087 U

(51) Int. Cl.
*G01D 5/20* (2006.01)
*G01L 3/10* (2006.01)
*G01R 33/00* (2006.01)

(52) U.S. Cl.
CPC ............ *G01D 5/2013* (2013.01); *G01L 3/105* (2013.01); *G01R 33/0017* (2013.01)

(58) Field of Classification Search
CPC ..... G01D 5/2013; G01L 3/105; G01R 33/0017
See application file for complete search history.

(56) References Cited

U.S. PATENT DOCUMENTS

| 6,553,847 | B2 | 4/2003 | Garshelis | |
|---|---|---|---|---|
| 2010/0242626 | A1* | 9/2010 | Weng | G01L 3/102 73/862.333 |
| 2012/0169328 | A1* | 7/2012 | Williams | G01R 15/20 324/251 |

* cited by examiner

*Primary Examiner* — Clayton E Laballe
*Assistant Examiner* — Jas Sanghera
(74) *Attorney, Agent, or Firm* — Thompson Coburn LLP

(57) ABSTRACT

A device compensates for the an influence of a magnetic field gradient which may be generated due to a component geometry of a component (1). The device includes at least two magnetic field sensors (17, 18) which are arranged outside of the magnetic balance of the ferromagnetic component (1). The at least two magnetic field sensors (17, 18) each have a differing sensitivity. One of the magnetic field sensors (17, 18) is exposed to the influence of the magnetic field gradient to a greater extent compared to the other magnetic field sensor due to its spatial arrangement relative to the ferromagnetic component (1). The one magnetic field sensor may have a sensitivity lower than the other magnetic field sensor.

20 Claims, 2 Drawing Sheets

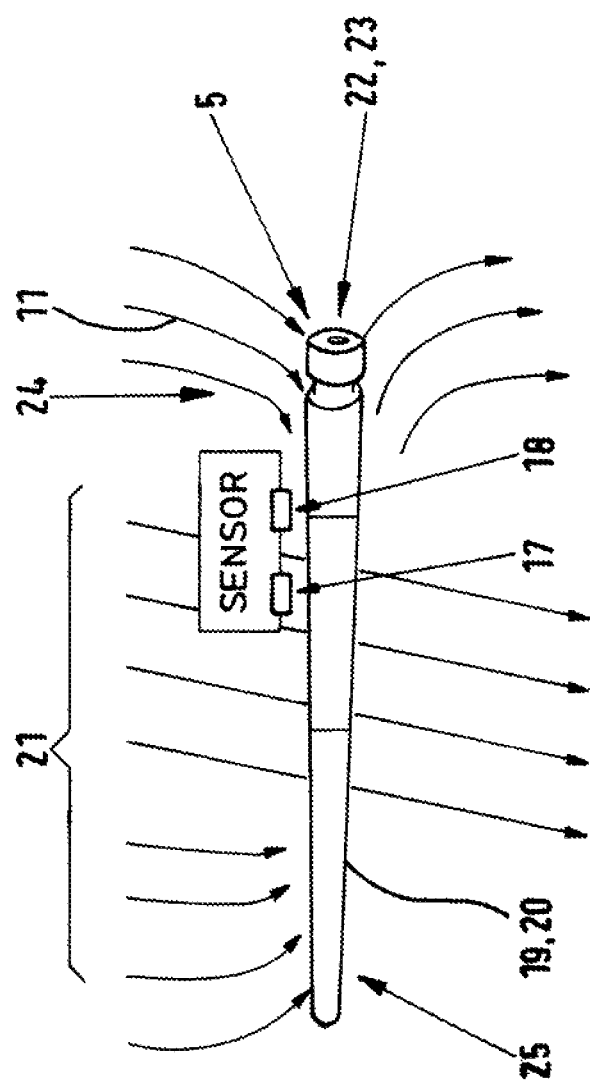

DEVICE FOR COMPENSATING EXTERNAL MAGNETIC STRAY FIELDS OR FOR COMPENSATING THE INFLUENCE OF A MAGNETIC FIELD GRADIENT ON A MAGNETIC FIELD SENSOR

RELATED APPLICATION DATA

This application claims priority to German patent applications DE 10 2015 116 303.9 filed on Sep. 25, 2015 and DE 20 2015 105 087.9 filed on Sep. 25, 2015, the disclosures of which are incorporated by reference herein.

DESCRIPTION

The invention relates to a device for compensating external magnetic stray fields or, in other words, for compensating an influence of a magnetic field gradient on a magnetic field sensor.

PRIOR ART

U.S. Pat. No. 6,553,847 B2 discloses a magnetoelastic sensor which provides an output signal representing the action of a torque on a shaft, with a magnetic field being generated on the shaft.

A magnetic field sensor is arranged in the area of the magnetic field of the shaft. The magnetic field sensor measures the action of the torque acting on the shaft on the magnetic field.

A magnetisation of a metal body is generated due to the approach of a magnetic material towards the magnetisable metal body or the application of electric power or a temporal change of a magnetic field.

The magnetisation of the metal body is illustrated by magnetic field lines showing the direction and the sense of direction of the magnetisation or the magnetic flux at each point of the magnetic field.

Magnetic field lines have neither a starting point nor an ending but run in closed loops.

The magnetic field lines exit the magnetized metal body at the north pole of the magnet or magnetized body and enter the magnet or magnetized body again at the south pole.

Such magnetic fields can be detected and/or measured by magnetic field sensors and evaluated by means of equipment integrated therein or associated therewith.

Magnetic field sensors are used, for example, in vehicle manufacturing as well as in the manufacturing of electric tools and electric household appliances. Preferably, they serve the purpose of controlling mechanical processes. They are gaining importance in the context of higher safety and quality requirements, for example when measuring different physical parameters. Magnetic field sensors are preferably used in measurement, control and test devices. In addition, magnetic field sensors are used in machinery and equipment as well as for the speed control of electric motors.

In addition, magnetic field sensors are increasingly used for the detection of forces which may act on a metal magnetized body. Such forces may, for example, occur due to the—in particular increased—application of torque to a shaft which is magnetized. This is because such a force has effects on the stress in the component, which changes the magnetic field position of the respective body and which may be detected by means of magnetic field sensors.

These magnetic field sensors are arranged in spatial proximity to the body having or emitting magnetic fields, with the spatial proximity being influenced by factors such as space requirement, reception strength or the like.

Such magnetic field sensors are normally arranged spaced apart from the respective magnetisable or magnetized body.

Ideally, such magnetic field sensors are spatially arranged in such a manner that they may use a position with a neutral magnetic field (magnetic balance) of a magnetized metal body. To put it simply, the magnetic balance of the respective magnetized metal body is often in the center of the respective magnetized metal body.

In the individual case, the aforementioned magnetic balance of the respective magnetized metal body may, however, be influenced by various factors or cannot be used at least for magnetic field sensors.

For reasons of limited space, it may, for example, be necessary to arrange the magnetic field sensors outside of the spatial area of said magnetic balance.

In this arrangement of magnetic field sensors, which will be described below as being spatially non-symmetrical, compared to the magnetic balance of the magnetized metal body, an external interfering magnetic field, which will also be described below as being non-symmetrical and which results in a faulty measurement signal, can often be detected by the magnetic field sensors.

In this respect, however, at least two basic configurations are to be distinguished primarily for purposes of explanation, regardless of the influence of external magnetic fields.

If, for example, two magnetic field sensors are arranged radially spaced apart and spatially non-symmetrically in relation to a (single) magnetized body or component, for example a steering shaft, and a force such as a torque is applied to said component, the magnetic field sensors must be capable of detecting the magnetic field generated by the application of force despite the non-symmetrical arrangement thereof.

Likewise, the magnetic balance of the respective magnetized metal body may be influenced when the latter cooperates constructively and/or functionally with a second non-magnetized metal body and the structure acts as a magnetic field antenna. If the respective magnetized metal body emits a magnetic field, for example under application of torque, the magnetic field sensors must be capable of detecting a magnetic field influenced in such a manner also in a configuration in which two metal bodies exist and the magnetic field sensors are arranged non-symmetrically in relation to the magnetized component.

When the magnetic field sensors are arranged in the respective spatial area, they detect the magnetic fields existing therein.

In the event that the concentration of magnetic fields of a ferromagnetic component or, as in the aforementioned example of the cooperation of at least two metal bodies, that is of two ferromagnetic components differs at least in some areas, said magnetic fields result in a difference value. Thus, in the present invention, this is referred to as a magnetic field gradient or as a gradient of magnetic flux densities.

The greater the difference in the density of the magnetic fields in the respective areas of the ferromagnetic component, the higher is the magnetic field gradient.

Since in cases of two basic configurations of the aforementioned type at least two magnetic field sensors, which in turn are spaced apart from one another, are normally used, for example in the axial direction and spaced apart from the measuring object(s), the magnetic field generated, for example, due to the application of stress to the body may therefore be detected by both sensors and the respective results therefrom related to the individual sensors be correlated with one another.

Thus, the present configurations may be summarized to the effect that a component-immanent influence or change of the magnetic field position is exerted on the ferromagnetic component respectively affected. In the aforementioned exemplary cases, the component-immanent influence or change of the magnetic field position may, for example, be caused by the application of a separate force or a separate torque. Another problem relating to the invention may, however, arise in cases where one or more external magnetic fields act on such ferromagnetic components, generating a magnetic field gradient in the area in which the differential sensors are arranged and falsifying the result of measurement.

Insofar as the singular form will be used below in respect of such an external magnetic field, this merely serves the purpose of providing a simplified representation and does not imply a restriction in number. Hence, a single external magnetic field as well as a plurality of magnetic fields acting on such ferromagnetic components may be concerned.

For example, such an external magnetic field may be the (homogeneous) earth's magnetic field. It is, however, also possible that another magnetic field acts, for example temporarily, on the ferromagnetic components. Such a situation may, for example, occur when the ferromagnetic components are arranged approximately in proximity to further electric components or when, for example, the ferromagnetic components are installed in a vehicle moving, for example, near an electric cable of a tram, crossing tram tracks or the like. All such external magnetic fields act on the ferromagnetic components described above. These are so-called magnetic stray fields.

These magnetic stray fields may influence or overlap the magnetic field position described above, which is, for example, generated by a force acting on a magnetized metal body.

In the first configuration of a single magnetized body, for example a steering shaft, especially the face side or front thereof acts as a so-called magnetic field antenna in the event that an external magnetic field occurs, because—like the electric current—the magnetic field lines or the magnetic fields seek the path of least resistance and thus concentrate at the end of the ferromagnetic component. If magnetic field sensors are arranged, thus non-symmetrically positioned, in this spatial area, they are subjected to a possible additional influence of the magnetic field position due to an external magnetic stray field.

In this case, a concentration of the magnetic fields with respective magnetic field gradients occurs.

In the aforementioned second configuration, too, an external magnetic stray field may influence, falsify or overlap a component-immanent magnetic field position. If, for example, a non-magnetized crank shaft is attached to a magnetized metal driving disc and if, for example, the at least two magnetic field sensors are arranged axially or radially spaced apart in the area of the face side of the crank shaft, thus in the connection area of the crank shaft and the driving disc, such an external magnetic field may also lead to an influencing or overlapping of the magnetic field occurring due to an application of force.

Such a magnetic field generated by the application of force will be also referred to below as being stress-based.

For, due to the effect described above, the magnetic field lines of this external magnetic stray field concentrate in the area of the face side of the crank shaft, which thus also takes over the function of a magnetic field antenna. Therefore, the detection of the magnetic field position by the magnetic field sensors arranged in this area is influenced to a great extent by such a concentration of the external magnetic stray field.

The influencing of the magnetic position by an external magnetic stray field affects the accuracy of detection or measurement and, as the case may be, evaluations of stress-based magnetic fields of the respective magnetized metal body.

Thus, the situation outlined above can also be described as a magnetic non-symmetry of metal bodies in relation to the positioning of the magnetic field sensor(s) based on a deflected external magnetic field.

Therefore, the invention is based on the problem to provide a device and a method for compensating external magnetic stray fields or for compensating the influence of a magnetic field gradient on a magnetic field sensor.

Irrespective of the compensation of external stray fields, the magnetic field sensors are designed to detect and evaluate the stress-based magnetic field changes of magnetized metal bodies.

In addition, such a device should preferably be adaptable to all possible installation circumstances.

The device should permit to solve these problems precisely and in a cost-effective manner.

Preferably, it should be possible to omit further apparatus and devices, in particular with regard to external stray fields.

In addition, a method for such compensation and a use of this technology should be provided.

SUMMARY

The invention provides the arrangement of at least two magnetic field sensors with the possibility of compensating external magnetic stray fields which are deflected/concentrated due to the asymmetrical alignment of magnetized or non-magnetized metal bodies in relation to the sensor.

The deflection takes place in the direction towards a metal body which has the effect of a magnetic field antenna and at the entry and exit points of which the magnetic fields concentrate.

The invention discloses, in particular, a device for compensating the influence of a magnetic field gradient on a magnetic field sensor which is arranged in the area of a ferromagnetic component.

In the present case, compensation is understood to mean the reduction or elimination of the influence of external magnetic stray fields.

The device according to the invention for compensating external magnetic stray fields in relation to a ferromagnetic component comprises at least two magnetic field sensors which each have a differing sensitivity, wherein the magnetic field sensor which, compared to the other magnetic field sensor, detects a higher strength of the non-symmetrical magnetic field of the ferromagnetic component has a sensitivity differing from the sensitivity of the other magnetic field sensor, wherein especially the magnetic field sensor which, compared to the other magnetic field sensor, detects a higher strength of the non-symmetrical magnetic field of the ferromagnetic component has a lower sensitivity than the other magnetic field sensor.

The invention will be described below in greater detail with reference to essential functional parts and components of the device.

Merely by way of example and for explanatory purposes only, two configurations are assumed.

The exemplary embodiment of the first configuration relates to the arrangement of at least two magnetic field sensors outside of the magnetic balance of a single magnetized metal body, for example a steering shaft. An external magnetic stray field exerts its influence.

The exemplary embodiment of the second configuration relates to the cooperation of two ferromagnetic components in the connection area of which two magnetic field sensors arranged spaced apart therefrom. By way of example, a connection of a non-magnetized crank shaft to a magnetized driving disc, also referred to below as a flex plate, are assumed. The flex plate is attached to the face side of the crank shaft. In the area of the face side, at least two magnetic field sensors are also arranged at a certain distance therefrom. It is assumed that the flex plate generates a magnetic field under stress, but an external magnetic stray field also exerts its influence.

For the purpose of identifying the aforementioned bodies in both configurations more precisely, the non-magnetized body of the second configuration, thus in the example of the crank shaft, will be referred to as a ferromagnetic body or non-magnetized body, whereas the remaining bodies in both configurations are described as magnetized metal bodies. Especially under stress, both magnetized bodies emit a magnetic field, and thus each may also be referred to as a magnetic field emitter. All three bodies are ferromagnetic components within the meaning of the terminology according to the invention.

Ferromagnetic Body

It is assumed by way of example that the ferromagnetic body is a crank shaft of a vehicle. It may, however, also be a control shaft, a cam shaft or another shaft for the transmission of torque or another ferromagnetic component. It is readily apparent that the magnetic balance may differ, for example in a cam shaft and in a straight shaft, with the material being otherwise the same.

Magnetic Field Concentrator

If, in the second configuration, a magnetized body is located, for example, in the area of the ferromagnetic component, the ferromagnetic body acts as a magnetic field antenna or as a magnetic field concentrator. In the example of the first configuration, these effects are united in one component.

In addition, the effects of the magnetic field concentration due to the influence of an external magnetic stray field as described above may occur.

The magnetized or magnetisable metal body is arranged in spatial proximity to the ferromagnetic body. By way of non-limiting example, it is assumed that the latter is arranged on the face side of the ferromagnetic body. If necessary, it may be connected thereto.

It is assumed by way of example that the magnetic field concentrator is the crank shaft of a vehicle.

Magnetic Field Antenna

If, in the example of the second configuration, the magnetized metal body, for example a driving disc, is arranged, for example, on the face side of the ferromagnetic body, in the aforementioned example of the spatial arrangement thereof on the face side of the ferromagnetic body, the magnetic fields of the external magnetic stray field are attracted despite this circumstance and are at least partially deflected to the ferromagnetic body.

In the exemplary case of a crank shaft, the latter is the magnetic field antenna influencing the magnetic flux of external magnetic fields, thus, in this example, of the external magnetic stray field.

The deflection of the magnetic field lines coming from an external magnetic stray field to the ferromagnetic body takes place due to the aforementioned magnetic field antenna function. It is assumed that—like the electric current—the magnetic field lines or the magnetic fields seek the path of least resistance and therefore concentrate at the end of the ferromagnetic component, thus, in the exemplary case, on the face side of the crank shaft. The ends of the ferromagnetic body, in particular, have the highest magnetic field concentration.

In the area of the face side of the ferromagnetic body, the magnetic field concentration thus increases in relation to the remaining areas of the ferromagnetic component.

The higher magnetic field concentration of the ferromagnetic body in the area of the face sides of the ferromagnetic body generates a gradient exponentially decreasing towards the magnetic balance in the center. It is assumed that a magnetic field gradient in air is created in this way.

In the spatial transition area towards the ferromagnetic body (here: on the face side thereof), to which the magnetic fields are deflected, the external magnetic stray field is thus stronger than in the remaining area of the ferromagnetic component.

The effect described above also occurs in the first configuration, in which only one (single) magnetized body exists, the face sides of which virtually generate a magnetic field gradient towards the balance.

Magnetic Field Gradient and Magnetic Field Sensor

A magnetic field sensor measures the magnetic flux density and field strength of the magnetic field and transmits them in analyzable form preferably to an electronic device for signal processing. The magnetic flux density is measured in the unit T (Tesla).

Sensors may be classified according to their operation principle, for example into magnetic, optical, inductive and mechanical sensors.

In the following, a magnetic sensor will be assumed by way of example.

Magnetic field sensors are, for example, used in the form of fluxgates, Hall probes or potential coils.

Furthermore, a magnetic field sensor, preferably a fluxgate sensor, will be assumed by way of non-limiting example.

Magnetic field sensors work in a contactless manner and thus without external mechanical operating force.

Preferably, the evaluation of the signal generated by the magnetic field on the respective sensor is carried out in a continuous, analogue or digital manner, namely either directly or by means of integrated or downstream electronics.

In the present case, each magnetic field sensor comprises at least one magnetic field sensor coil. The at least one coil preferably includes wire windings.

Thus, two magnetic field sensors include at least two magnetic field sensor coils. The magnetic field sensor coils are preferably arranged adjacent to one another. In their position in relation to one another, they can measure a so-called inner band and an outer band as well as the magnetic field emitting from the bands.

They may be accommodated in a housing.

Spatial Arrangement of the Magnetic Field Sensor

At least two magnetic field sensors are provided which, in the example of the second configuration, are arranged at a spatial distance from the magnetic body as well as the ferromagnetic body.

In both configurations, they are, for example, arranged outside of the space formed by the magnetic balance of the ferromagnetic components if necessary, depending on the space available. The distance is, of course, not only determined according to the space available but also according to the sensitivity available or desired or according to the strength of the magnetization.

The magnetic field sensors may be arranged in the spatially distant area of the ferromagnetic component to which the magnetic fields of the external magnetic stray field are deflected rather than in the remaining area of the ferromagnetic component which is located further from this area.

They may, for example, be arranged spaced apart, e.g. above the face side of the crank shaft or the steering shaft, with the effect of the magnetic field antenna having the greatest influence on the face side.

The magnetic field gradient may be generated due to a component geometry of at least one magnetic field antenna.

The magnetic field sensors may be arranged either axially and/or horizontally and/or parallel to the ferromagnetic component as well as the magnetized body.

Preferably, the arrangement is spaced apart from the ferromagnetic component and/or the magnetized body.

Preferably, the magnetic field sensors first detect or measure the magnetic flux density and field strength of the magnetic field generated by stress and preferably transmit the results in analyzable form to an electronic device for signal processing and/or for display.

This transmission may relate to the result either before or after the compensation of the external magnetic stray field.

In its axial or radial arrangement relative to the magnetized body or to the ferromagnetic component, due to the magnetic field gradient, each of the two magnetic field sensors continues to be exposed to a magnetic field of varying strength of the external magnetic field.

In the event that both magnetic field sensors are arranged axially to the magnetized body or to the ferromagnetic component, the magnetic field sensor which is located closest to the magnetic field with higher flux density is exposed to a stronger magnetic field due to the magnetic field gradient. In many cases, this is the sensor which is spaced closer to the end of the ferromagnetic component.

In case of a radial arrangement of the two magnetic field sensors relative to the ferromagnetic component, the magnetic field sensor which is arranged spatially closer to the ferromagnetic component is exposed to a stronger magnetic field due to the magnetic field gradient.

Sensitivity of the Magnetic Field Sensors

In order to avoid the disadvantages of the prior art described at the beginning, the invention provides the possibility of compensating external magnetic stray fields which are deflected due to the alignment of magnetized metal bodies in relation to the sensor.

For this purpose, at least two magnetic field sensors are provided, each of which having a differing sensitivity.

One magnetic field sensor has a sensitivity which differs from the sensitivity of the other magnetic field sensor.

The magnetic field sensor which, due to the closer proximity to the body, is exposed to the influence of the magnetic field to a greater extent than is the case with the other sensor has a differing lower sensitivity.

In case of magnetic field sensors arranged radially in relation to the magnetized body, the increased influence of the magnetic field is, for example, based on the fact that one magnetic field sensor is spatially arranged radially closer to the body than the other magnetic field sensor which is radially more distant.

The same applies vice versa to an axial arrangement of the magnetic field sensors.

Compensation of the Influence of External Magnetic Stray Fields

As set out above, the external magnetic stray fields due to a concentration of a magnetic field in some areas result in the formation of a magnetic field gradient.

For compensating the influence of external magnetic stray fields and thus for compensating the influence of the magnetic field gradient generated due to the component geometry as well as for achieving the differing sensitivity, each single magnetic field sensor has an individual channel. Instead of the individual channel, fluxgates of varying sensitivity may, for example, also be used.

The channel comprises the medium via which the signal transmission is carried out as well as the entire transmission path from a transmitter to a receiver.

For the purpose of compensating the influence of the magnetic field gradient on the two magnetic field sensors, the channels of the respective magnetic field sensors are controllable in such a manner that the influence of the magnetic field gradient on the magnetic field sensor may be controlled through the sensitivity of the associated channel.

In an alternative embodiment, the sensitivity of the magnetic field sensor may be controlled by variations of the number of windings of the coil of the respective magnetic field sensor. The above description basically also applies to the aforementioned configuration, which is characterized by an arrangement of the magnetic field sensors outside of the magnetic balance, but with the gradient of the stress-based magnetic field of a single magnetized metal body being missing. The metal body is also the magnetized component. Due to the fact that the magnetic field sensors are placed at the end of this body, the magnetic field gradient is generated, which is reduced or eliminated according to the above explanations.

Furthermore, the magnetic field generated by an application of force is detected.

In a further embodiment, the at least two magnetic field sensors are not only capable of detecting and compensating the influence of external magnetic stray fields but, if necessary, also of detecting magnetic fields generated due to an application of force in addition to external magnetic stray fields.

For this purpose, they detect these magnetic fields generated on the surface of the magnetic field emitter. Such stress-based magnetic fields are generated due to a stress occurring on the surface of the respective magnetic field emitter. Analogous to this stress, the magnetic result is configured in a linear manner.

Thus, the stress and the magnetic field based thereon behave linearly. The same also applies with regard to the application of varying forces.

The magnetic field sensors according to the invention are constructed in such a way that they do not only detect and compensate the aforementioned external magnetic fields related to the magnetic field gradient but also detect the stress-based magnetic fields configured in a linear manner. Thus, they are configured such that they are capable of distinguishing between these two types of magnetic fields generated and arranged in a different manner and of individually or jointly detecting the latter.

The information obtained by the detection is also transmitted to an evaluation and/or display unit.

DESCRIPTION OF DRAWINGS

Advantageous embodiments and variant embodiments will be described in greater detail with reference to the drawings below, in which:

FIG. 2 shows a magnetized body in the form of a steering shaft with axially arranged magnetic field sensors.

DETAILED DESCRIPTION

Figure 1:
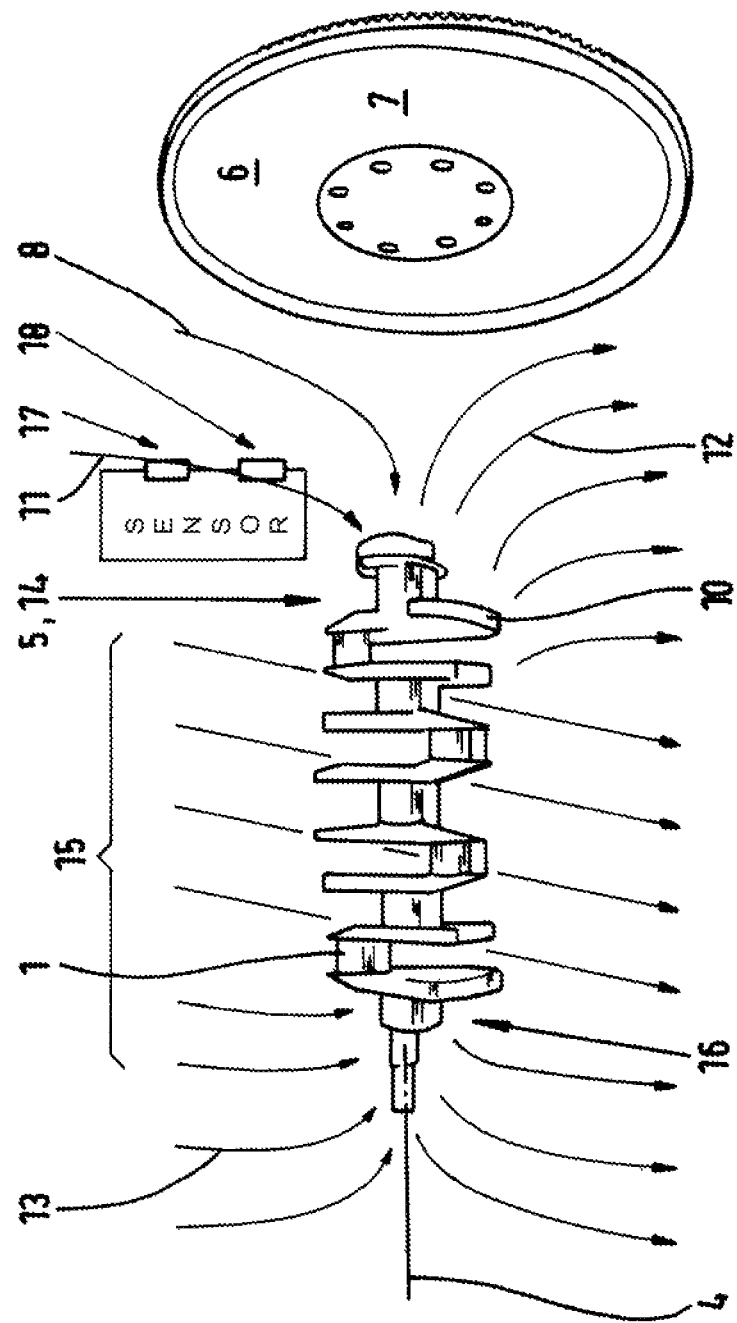
FIG. 1 shows a non-magnetized ferromagnetic component in the form of a crank shaft which is connected to a magnetized driving disc as well as radially arranged magnetic field sensors.

The non-magnetized crank shaft 1 (ferromagnetic component) is rotatable about a rotational axis 4. A magnetized metal body 6 in the form of a driving plate 7 is arranged in the area of a front end 5 of the crank shaft 1.

The external magnetic stray field (non-illustrated source) emits a magnetic field with magnetic field lines 11, 8, 13, 15, 12.

The crank shaft 1 acts as a magnetic field antenna 10; in the area 14 at the front end 5 thereof, the magnetic field lines (not illustrated) concentrate.

The magnetic field antenna 10 receives magnetic field lines 11, 8, 13, 15 while at the same time releasing magnetic field lines 12 of the external magnetic field.

The ferromagnetic component 1 (here: the crank shaft) thus includes a magnetic field 13 which has at least one magnetic field gradient at least at one end of the crank shaft.

In other words, if there is a gradient at one end, there is also a gradient at the other end.

Two magnetic field sensors 17, 18 are arranged radially in relation to the crank shaft 1 (ferromagnetic component). Due to its closer proximity to the crank shaft 1, the magnetic field sensor 18 is exposed to a stronger external magnetic field than the magnetic field sensor 17.

This is due to the fact that the crank shaft 1 acts as a magnetic field antenna 10 and the magnetic field of the crank shaft 1 becomes more dense in the area 14 as a result of the deflection of the magnetic field lines 8, 11.

Reference numeral 15 shows the magnetic field area with lower gradients acting on the crank shaft 1.

Due to its greater spatial distance from the stronger magnetic field 14 in the area of the crank shaft 1, the magnetic field sensor 17 is exposed to the stronger magnetic 14 field to a lesser extent.

Reference numeral 16 shows the end of the crank shaft 1 facing away from the driving plate 6.

The signals detected by the magnetic field sensors 17, 18 are transmitted to an evaluation and/or display unit (not illustrated).

In FIG. 2, the magnetic body 20 is illustrated as a steering shaft 19.

The steering shaft 19 has a front end 5 and a back end 25 opposite thereto.

The steering shaft 19 includes a magnetic field 21. Its front end 23 is configured in the form of a magnetic field concentration area 22.

The magnetic field lines 11, 21 coming from the outside are deflected to the steering shaft 19 acting as a magnetic field antenna.

As a result, a concentrated magnetic field 24 is generated at the front end 23 and the back end 25 of the steering shaft 19.

Compared to the remaining magnetic field 21 of the steering shaft 19, the magnetic field area 24 of the steering shaft 19 has a higher concentration due to the magnetic field lines 11.

Since the magnetic field of the steering shaft 19 has a higher density in the area 24 than in the remaining area 21, in case of FIG. 2, too, there is a magnetic field gradient extending from the ends towards the center on the steering shaft 19.

Both in FIG. 1 and in FIG. 2, the magnetic field sensors 17 and 18 are arranged outside of the magnetic balance.

In FIG. 2, the magnetic field sensor 18 is exposed to a larger magnetic field than the magnetic field sensor 17 due to the proximity of its arrangement in relation to the more concentrated magnetic field 24 of the steering shaft 19.

In FIG. 2, the magnetic field sensors 17, 18 first detect or measure the magnetic flux density and field strength of the magnetic field and transmit the results in analyzable form to an electronic device 30 for signal processing and/or for display.

REFERENCE NUMERALS 1. ferromagnetic component/crank shaft
2. not assigned
3. not assigned
4. rotational axis
5. front end of the crank shaft
6. magnetized metal body
7. driving plate as an example of a magnetized body
8. magnetic field line of the external magnetic stray field
9. not assigned
10. magnetic field antenna configured in the form of a crank shaft 1
11. magnetic field line of the external magnetic stray field
12. magnetic field lines (exiting)
13. magnetic field lines (entering)
14. area of highly concentrated magnetic field lines (schematic)
15. area of non-highly/still gradient-concentrated magnetic field lines (schematic)
16. back end of the crank shaft
17. magnetic field sensor
18. magnetic field sensor
19. steering shaft as an example of a magnetized body
20. magnetized metal body
21. magnetic field lines (entering)
22. magnetic field concentration area
23. front end of the ferromagnetic component
24. front area of the concentrated magnetic field
25. back area of the concentrated magnetic field
26.-29. Not assigned
30. display or evaluation unit

What is claimed is:

1. A device for compensating an external magnetic stray field comprising:
   at least two magnetic field sensors (17, 18), one of the magnetic field sensors (17, 18) being arranged to detect a higher strength of an external magnetic field acting on a ferromagnetic component and having a sensitivity different from the other magnetic field sensor (17, 18).

2. The device according to claim 1, characterized in that the one magnetic field sensor (17, 18) that detects the higher strength of the external magnetic field has a lower sensitivity than the other magnetic field sensor (17, 18).

3. The device according to claim 2, characterized in that the magnetic field sensor (17, 18), that detects a higher strength of the external magnetic field is arranged spatially closer to a more concentrated area of the ferromagnetic component (1, 20).

4. The device according to claim 2, characterized in that the magnetic field sensor (17, 18), that detects a lower strength of the external magnetic field has a higher sensitivity than the other magnetic field sensor (17, 18).

5. The device according to claim 2, characterized in that the magnetic field sensors (17, 18) are arranged axially relative to the ferromagnetic component (1) in an area of increased concentration of the magnetic fields (8, 11) of the external magnetic field.

6. The device according to claim 2, characterized in that the magnetic field sensors (17, 18) are arranged radially relative to the ferromagnetic component (1) in an area of increased concentration of the magnetic fields (8, 11) of the external magnetic field.

7. The device according to claim 2, characterized in that the magnetic field sensors (17, 18) are configured to generate signals representative of the external magnetic field.

8. The device according to claim 7, further comprising an evaluation and/or display unit (30) configured to receive the signals generated by the magnetic field sensors (17, 18).

9. The device according to claim 2, characterized in that the at least two magnetic field sensors (17, 18) are configured to detect a magnetic field generated by application of force on the ferromagnetic component (1).

10. The device according to claim 2, characterized in that the at least two magnetic field sensors (17, 18) are configured to distinguish between the external magnetic field and a linearly configured magnetic field of a component-immanent magnetic field.

11. A method for compensating an external magnetic stray field comprising:
   providing at least two magnetic field sensors (17, 18), one of the field sensors (17, 18) having a lower sensitivity as compared to the other of the field sensors; and
   arranging the magnetic field sensor with the lower sensitivity (17, 18) to detect a higher strength of the external magnetic field.

12. The method of claim 11, wherein the step of arranging the magnetic field sensor with the lower sensitivity (17, 18) to detect a higher strength of the external magnetic field includes arranging the magnetic field spatially closer to a more concentrated area of the ferromagnetic component (1, 20).

13. The method of claim 11, further comprising arranging the magnetic field sensors (17, 18) axially relative to the ferromagnetic component (1) in an area of increased concentration of the magnetic fields (8, 11) of the external magnetic field.

14. The method of claim 11, further comprising arranging the magnetic field sensors (17, 18) radially relative to the ferromagnetic component (1) in an area of increased concentration of the magnetic fields (8, 11) of the external magnetic field.

15. The method of claim 11, wherein the step of providing at least two magnetic field sensors (17, 18) includes configuring the magnetic field sensors (17, 18) to generate signals representative of the external magnetic field.

16. The method of claim 15, further comprising providing an evaluation and/or display unit (30) configured to receive the signals generated by the magnetic field sensors (17, 18).

17. The method of claim 11, wherein the step of providing at least two magnetic field sensors (17, 18) includes configuring the at least two magnetic field sensors (17, 18) to detect a magnetic field generated by application of force on the ferromagnetic component (1).

18. The method of claim 11, wherein the step of providing at least two magnetic field sensors (17, 18) includes configuring the at least two magnetic field sensors (17, 18) to distinguish between the external magnetic field and a linearly configured magnetic field of a component-immanent magnetic field.

19. A method comprising:
   providing at least two magnetic field sensors (17, 18) configured to detect a non-symmetrical external magnetic field, one of the field sensors (17, 18) having a lower sensitivity as compared to the other of the field sensors; and
   arranging the magnetic field sensor with the lower sensitivity (17, 18) to detect a higher strength of the non-symmetrical external magnetic field.

20. The method of claim 19, wherein the step of providing at least two magnetic field sensors (17, 18) includes configuring the at least two magnetic field sensors (17, 18) to distinguish between the non-symmetrical external magnetic field and a linearly configured magnetic field of a component-immanent magnetic field.

* * * * *